(12) United States Patent
Khemka et al.

(10) Patent No.: US 6,703,895 B1
(45) Date of Patent: Mar. 9, 2004

(54) SEMICONDUCTOR COMPONENT AND METHOD OF OPERATING SAME

(75) Inventors: Vishnu Khemka, Mesa, AZ (US); Vijay Parthasarathy, Phoenix, AZ (US); Ronghua Zhu, Chandler, AZ (US); Amitava Bose, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/256,820

(22) Filed: Sep. 26, 2002

(51) Int. Cl.[7] .............................................. H01L 25/00
(52) U.S. Cl. ..................... 327/564; 327/565; 327/566
(58) Field of Search ................................. 327/564, 565, 327/566; 438/275; 357/36, 35; 257/341, 365, 401, 404

(56) References Cited

U.S. PATENT DOCUMENTS

| | | | | |
|---|---|---|---|---|
| 4,642,668 A | * | 2/1987 | Tacken ......................... | 357/36 |
| 5,031,014 A | * | 7/1991 | Soclof ......................... | 357/35 |
| 6,140,184 A | | 10/2000 | Dupuy et al. ............... | 438/275 |
| 2002/0074574 A1 | | 6/2002 | Chung et al. | |

OTHER PUBLICATIONS

E. James Angelo, Jr. Electronics: BJTs. FETs, and Microcircuits. Mc Graw–Hill Co. 1969. pp. 105–114.*
Khemka, et al., *Experimental and Theoretical Analysis of Energy Capability of Resurf LDMOSFETs and Its Correlation with Static Electrical Safe Operating Area (SOA)*, IEEE Transactions on Electron Devices, vol. 49, No. 6, 6/02.

* cited by examiner

*Primary Examiner*—Tuan T. Lam
*Assistant Examiner*—Hiep Nguyen
(74) *Attorney, Agent, or Firm*—Bryan Cave LLP

(57) ABSTRACT

An embodiment of a method of redistributing power in a semiconductor component includes varying a saturation current between a drain terminal (330) and a source terminal (320) of a field effect transistor (FET) (200, 500). The FET is at least a portion of the semiconductor component. The threshold voltage of the FET is maintained substantially constant across the FET while the drain-to-source saturation current per unit area is varied across the FET. In one embodiment, the drain-to-source saturation current per unit area is varied such that it is lower at a center of the FET than at a periphery of the FET. In particular embodiments, the drain-to-source saturation current per unit area may be varied across the FET by changing one or more of the gate-to-source voltage, the channel length, the channel width, the gate oxide thickness, and the channel mobility across the FET.

35 Claims, 4 Drawing Sheets

SEMICONDUCTOR COMPONENT AND METHOD OF OPERATING SAME

FIELD OF THE INVENTION

This invention relates generally to semiconductor components, and relates more particularly to field effect transistors and methods of operation.

BACKGROUND OF THE INVENTION

Power devices are electronic components designed to be tolerant of high current and voltage. Two parameters that affect the operating range of power devices are specific on-resistance ($R_{ds\ (on)}$) and energy capability. Reductions in $R_{ds\ (on)}$ have led to significant advances in the technology of power devices, making possible the introduction of, for example, power lateral double-diffused metal-oxide-semiconductor (LDMOS) field-effect-transistor (FET) devices, referred to herein as power LDMOS devices and power FETs. As an example, power LDMOS devices can have drain-to-source breakdown voltages in the range of approximately 20–70 volts (V).

As the sizes of power LDMOS devices are reduced, however, the power densities of the power LDMOS devices increase, which introduces new challenges relative to energy capability optimization for the power LDMOS devices. More specifically, given two power LDMOS devices of differing sizes and exposing such devices to the same amount of power, the smaller power LDMOS device will less readily dissipate that power because it possesses less area in which to do so. The energy capability of power LDMOS devices in the 40–60 V range and in the presence of harsh operating environments is a key technological requirement. In fact many applications, among them automotive fuel injector drivers, airbag deployment equipment, and anti-lock braking systems, require that the size of power LDMOS devices be determined based on energy capability rather than $R_{ds\ (on)}$.

The energy capability of a power LDMOS device is the amount of power the device is able to absorb during a given length of time without being destroyed. This concept may be represented by the formula E=(P)(t), where "E" represents energy, "P" represents power, and "t" represents time. Because power is equal to current (I) times voltage (V), the energy formula may be rewritten as E=(I)(V)(t), meaning that the energy capability of a power LDMOS device is related to the product of current, voltage, and time. Power LDMOS devices are constrained by natural material limitations of silicon and other semiconductor substances as to the amount of power or voltage such devices can absorb. This means that in order to maximize E, designers look for, among other things, ways to maximize the amount of voltage a power LDMOS device can safely withstand during a given length of time.

The energy capability of power LDMOS devices is limited by both thermal and electrical effects. The large amounts of energy involved in many power applications can cause the temperature of the power LDMOS device to increase dramatically, ultimately causing the failure of the device via thermal runaway. Device failure can also be induced electrically by snapback phenomena associated with the turn-on of a parasitic bipolar transistor within the power LDMOS device.

The destruction mechanism of a power LDMOS device, including both thermal and electrical effects as outlined in the preceding paragraph, is more fully discussed in "Experimental and Theoretical Analysis of Energy Capability of RESURF LDMOSFETs and Its Correlation With Static Electrical Safe Operating Area (SOA)," Khemka et al., IEEE Transactions on Electron Devices, Vol. 49, No. 6, June 2002, (the "IEEE Publication"). The reader's attention is particularly directed to Section IV of the IEEE Publication. The more power, or voltage and current, that is applied to a device, the higher its internal temperature will be. For a uniform power distribution across a power LDMOS device, the temperature profile peaks at a center of the device and falls off towards a periphery of the device. The center of a power LDMOS device, therefore, is typically the most problematic in terms of heat removal, and is where thermal breakdown is most likely to occur.

Various solutions to the thermal breakdown problem have been proposed. One such proposal is to place a thick metallization, possibly made of copper, on top of the integrated circuit (IC) that contains the power LDMOS device. The metallization is included for heat extraction purposes, but comes at the cost of including extra metal deposition, photolithographic masking, and etching steps, thus adding process complexity. Another proposal involves placing a bonding pad over the active area of the power LDMOS device to act as a heat sink. This solution is flawed because of the potential for damaging the active area of the power LDMOS device during a subsequent wire bonding process. All the existing solutions, including those outlined above, focus exclusively on alleviating the symptoms of the problem, and as such are limited in their effectiveness because such solutions do not address the cause of the problem. Therefore, a need exists for a method of operating a power LDMOS device that improves energy capability without increasing device cost, complexity, or size.

BRIEF DESCRIPTION OF THE DRAWINGS

The invention will be better understood from a reading of the following detailed description, taken in conjunction with the accompanying figures in the drawings in which.

Figure 1:
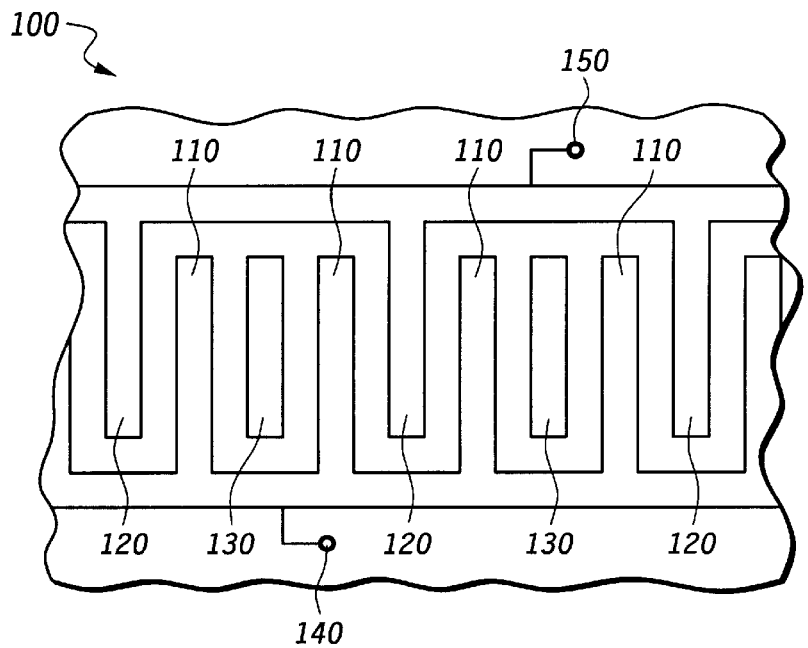
FIG. 1 is a top view of a portion of a conventional field effect transistor.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back, " "top," "bottom," "over, " "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In an embodiment of the invention disclosed herein, a method of improving energy capability in a semiconductor component comprises varying a saturation current between a drain electrode and a source electrode of a field effect transistor (FET) included in the semiconductor component. A threshold voltage of the FET is maintained substantially constant across the FET while the drain-to-source saturation current per unit area of the FET is varied across the FET. The drain-to-source saturation current per unit area is varied such that it is lower at a center of the FET than at a periphery of the FET, thus lowering the temperature of the FET at its center relative to its periphery. In particular embodiments, the drain-to-source saturation current per unit area may be varied by changing one or more of the gate-to-source voltage, the channel length, the channel width, the gate oxide thickness, and the channel mobility. It should be noted that these variations do not significantly affect the breakdown voltage of the FET.

A power FET is a FET designed for applications requiring high voltage and high current, defined herein as a voltage of approximately 20 volts or higher and a current of approximately 0.1 amperes or higher. It will be understood by one of ordinary skill in the art that when a power FET is turned on, i.e., operated in an on-state, the FET will first operate in a linear region, then in a triode region, next in the saturation region, and finally in a breakdown region, as the drain-to-source current rises from zero to a maximum value. More particularly, when a voltage applied to the drain of a power FET is much larger than a voltage applied to the source of the power FET and when a voltage applied to the gate of the power FET is greater than a threshold voltage for the power FET, the FET operates in what is known as the saturation region of the device. The voltage difference between source and drain sufficient to place a power FET in the saturation region is approximately one volt.

The drain-to-source saturation current is approximated by equation [1], where $\mu_n$ is channel mobility, $C_{ox}$ is gate oxide capacitance per unit area, W is channel width, L is channel length, $V_{gs}$ is gate-to-source voltage, and $V_t$ is threshold voltage.

$$I_{ds(sat)} = \mu_n C_{ox}(W/L)(V_{gs}-V_t)^2. \quad [1]$$

From the background given hereinabove, it may be seen that the energy capability of a FET is related to the drain-to-source saturation current as the FET is operated at a high drain voltage, i.e., approximately 20 V or more above the source voltage, during an energy pulse. In particular, as $I_{ds(sat)}$ decreases, temperature also decreases, and the lowered temperature allows more power to be applied to the FET without causing its destruction. This is equivalent to saying that the energy capability of the FET has increased.

In one embodiment, the drain-to-source saturation current is manipulated such that a center of the FET carries less current per unit area than a current per unit area carried at a periphery of the FET. In one embodiment, the device may be a 40-volt power LDMOS device having an area of approximately one square millimeter and a maximum critical temperature of approximately 350 degrees Celsius. A typical energy pulse may have a duration of approximately one millisecond. It will be understood by one of ordinary skill in the art, however, that FETs or devices of other descriptions, and energy pulses of other durations, may also be used. For example, an energy pulse lasting 50 or 100 microseconds or greater than one millisecond may also be used.

Referring now to the figures, and in particular to FIG. 1, a conventional FET 100 comprises a group of gate electrodes 110 separated by source electrodes 120 and drain electrodes 130. Gate electrodes 110 are coupled together and to a gate terminal 140. Source electrodes 120 are coupled together and to a source terminal 150. Drain electrodes 130 are coupled together and to a drain terminal (not shown in FIG. 1). Gate electrodes 110 are configured such that some adjacent gate electrodes share a common source electrode 120 while other adjacent gate electrodes share a common drain electrode 130. The conventional configuration is thus source, gate, drain, gate, source, gate, drain, gate, etc.

Figure 2:
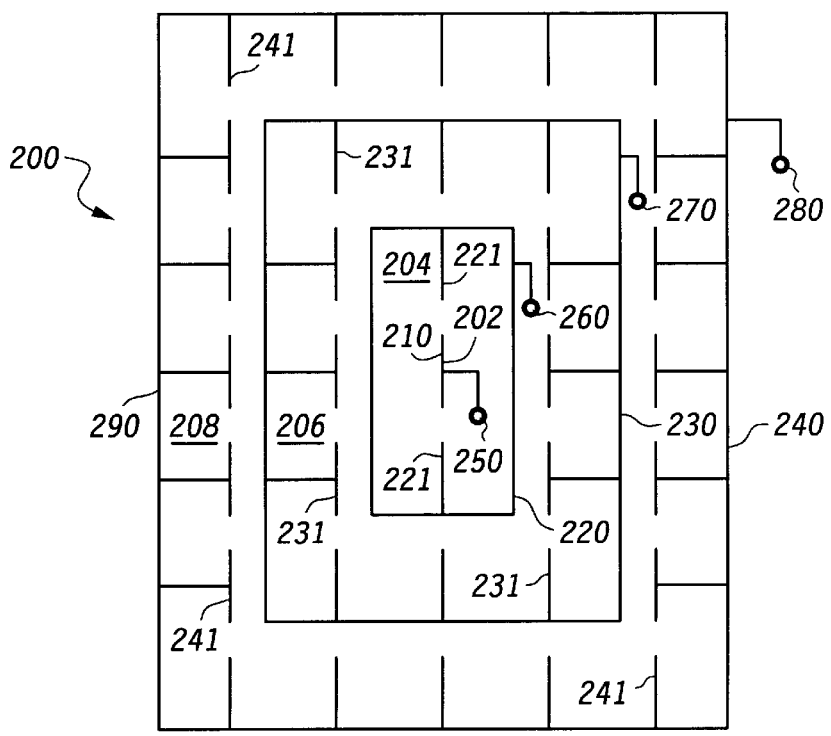
FIG. 2 is a top view of a portion of a field effect transistor according to an embodiment of the invention.

The configuration of FET 100 in FIG. 1 is shared by a FET 200 illustrated in FIG. 2, though, for simplicity, source and drain electrodes are not shown in FIG. 2. As an example, FET 200 can be a discrete device or a portion of an integrated circuit, both of which are examples of semiconductor components.

FET 200 comprises one or more gate electrodes 210 coupled to a gate terminal 250. FET 200 also comprises a ring 220 of gate electrodes 221 surrounding and located exterior to gate electrodes 210. A periphery 290 of FET 200 is closer to ring 220 of gate electrodes 221 than to gate electrodes 210. Gate electrodes 221 are coupled together and to a gate terminal 260. FET 200 further comprises a ring 230 of gate electrodes 231 surrounding and located exterior to ring 220. Periphery 290 is closer to ring 230 than to ring 220. Gate electrodes 231 are coupled together and to a gate terminal 270. FET 200 still further comprises a ring 240 of gate electrodes 241 surrounding and located exterior to ring 230. Periphery 290 is closer to ring 240 than to ring 230. Gate electrodes 241 are coupled together and to a gate terminal 280.

FET 200 also comprises a region 202, a region 204, a region 206, and a region 208, where such regions are concentric. Gate electrodes 210, 221, 231, and 241 are in regions 202, 204, 206, and 208, respectively. In another embodiment, FET 200 may comprise a different number of regions, each including gate electrodes together with drain and source electrodes, which, as mentioned earlier, are not shown in FIG. 2. Each one of regions 202, 204, 206, and 208 has an associated area and contributes to, generates, or produces a portion of drain-to-source saturation current for FET 200. The drain-to-source saturation current in each of regions 202, 204, 206, and 208 divided by the area of such region is different from the drain-to-source saturation current in the other ones of regions 202, 204, 206, and 208 divided by the area of such other regions. To provide the different drain-to-source saturation currents, each one of regions 202, 204, 206, and 208 has a value of one or more characteristics selected from the group consisting of gate-to-source voltage, channel length, channel width, gate oxide thickness, and channel mobility, that is different from the values of those characteristics in the other ones of such regions. This concept is explained in more detail hereinafter.

Figure 3:
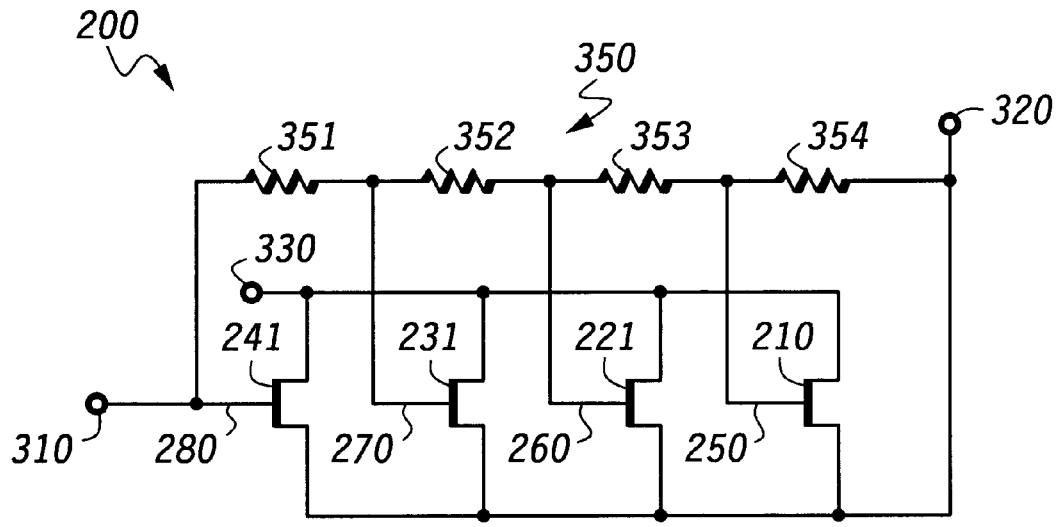
FIG. 3 is a schematic of a resistor-divider network and the field effect transistor of FIG. 2 according to an embodiment of the invention.
Figure 4:
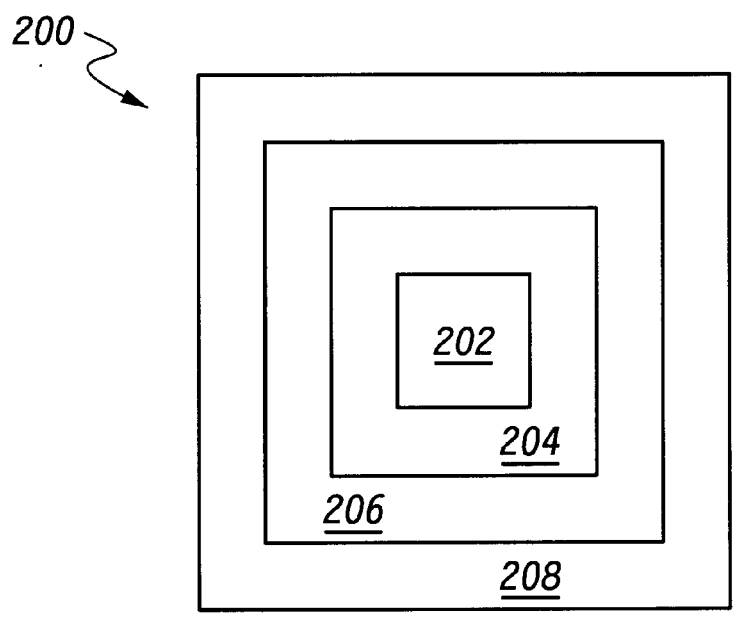
FIG. 4 is a block diagram of one embodiment of the field effect transistor of FIGS. 2 and 3 according to an embodiment the invention.

Referring now to FIGS. 3 and 4, FET 200, in one embodiment, is provided with different values of $V_{gs}$ in the different regions of FET 200 by using a resistor-divider network 350 comprising resistors 351–354. The sum of the resistances of resistors 351–354 will be represented herein by the symbol R. FET 200 comprises a gate terminal 310, a source terminal 320, and a drain terminal 330. Gate terminal 310 is coupled to gate electrodes 241, 231, 221, and 210 via resistor-divider network 350. Resistors 351–354 are arranged in such a way that a voltage at gate terminal 280 equals the voltage that is applied to gate terminal 310, which will be referred to in this discussion as VG. A voltage at gate terminal 270 is equal to the product of VG and the sum of the resistances of resistors 352–354, divided by R. A voltage at gate terminal 260 is equal to the product of VG and the sum of the resistances of resistors 353–354, divided by R. Finally, a voltage at gate terminal 250 is equal to the product of VG and the resistance of resistor 354, divided by R. The use of resistor-divider network 350 is one way of applying increasingly higher voltages to gate terminals 250, 260, 270, and 280, with the lowest voltage being applied to gate terminal 250 and the highest voltage being applied to gate terminal 280.

Gate terminals 250, 260, 270, and 280 are coupled to gate electrodes 210, 221, 231, and 241, respectively, which are located in regions 202, 204, 206, and 208 (FIG. 2), respectively, of FET 200. Although FIG. 3 shows single gate electrodes for each of gate electrodes 210, 221, 231, and 241, one skilled in the art will understand that gate electrodes 210, 221, 231, and 241 can each be comprised of a group of gate electrodes, as illustrated in FIG. 2.

Considering the schematic of FIG. 3, but viewing the embodiment of FIG. 4, $V_{gs}$ will be lowest in region 202, which is located at the center of FET 200, and will be increasingly higher through regions 204 and 206 until the highest value of $V_{gs}$ is reached in region 208 at the periphery of FET 200. Reducing $V_{gs}$ in region 202 of FET 200 reduces $I_{ds(sat)}$, as governed by equation [1], per unit area at the center of FET 200 with respect to the periphery of FET 200. As mentioned earlier, this is equivalent to reducing the temperature in the center of FET 200 with respect to the periphery of FET 200. With heat thus redistributed from the center to the periphery of FET 200, the energy capability of FET 200 is improved. Energy capability improvements of approximately 20% have been achieved using the layout illustrated in FIG. 4.

The improvement in energy capability obtained through the use of resistor-divider network 350 in FIG. 3 comes with no substantial penalty in terms of device size or $R_{ds\ (on)}$. As an example, resistor-divider network 350 may be constructed using readily-available polysilicon resistors in accordance with existing FET technology. For example, resistors 351–354 may be integrated with polysilicon gate routing. One of ordinary skill in the art will understand that resistor-divider network 350, in another embodiment, may comprise a greater or lesser number of resistors than the embodiment illustrated in FIG. 3. Resistor-divider network 350 may, in one embodiment, be located on the same chip as is FET 200. In another embodiment, resistor-divider network 350 may be located off-chip.

Figure 5:
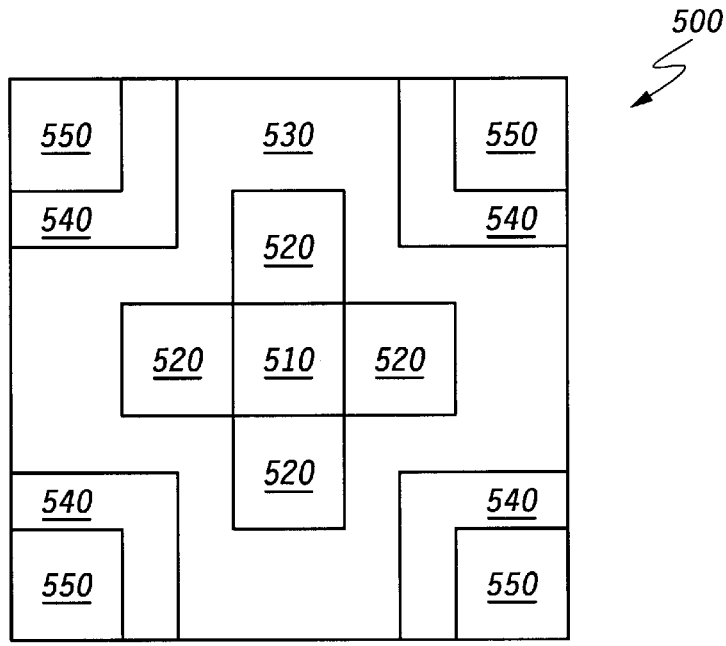
FIG. 5 is a block diagram of another field effect transistor according to an embodiment of the invention.

Referring now to FIG. 5, a FET 500 comprises a center region 510 and corner regions 550. FET 500 further comprises central regions 520 surrounding center region 510, an intermediate region 530 surrounding central regions 520 and center region 510, and intermediate regions 540 surrounding corner regions 550 and located between intermediate region 530 and corner regions 550. FET 500 can be a discrete device or a portion of an integrated circuit.

Energy capability may be improved in FET 500 by: (1) lowering $V_{gs}$ in center region 510 with respect to regions 520, 530, 540, and 550; (2) lowering $V_{gs}$ in central regions 520 with respect to regions 530, 540, and 550; (3) lowering $V_{gs}$ in intermediate region 530 with respect to regions 540 and 550; and (4) lowering $V_{gs}$ in intermediate regions 540 with respect to corner regions 550. In one embodiment, this $V_{gs}$ adjustment may be achieved using a resistor-divider network similar to that shown in FIG. 3. Energy capability improvements of approximately 25% have been achieved using the layout of FIG. 5.

Figure 6:
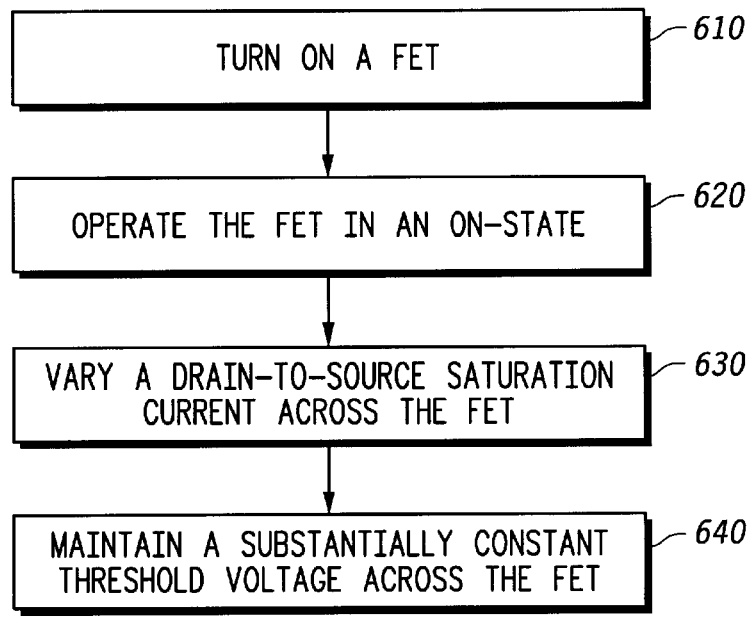
FIG. 6 is a flow diagram illustrating a method of operating a semiconductor component according to an embodiment of the invention.

Referring now to FIG. 6, a method 600 comprises one embodiment of a method of operating a semiconductor component having at least one FET, which may be, for example, a metal-semiconductor FET (MESFET), a metal-oxide-semiconductor FET (MOSFET), or a junction FET (JFET). Examples of suitable FETs include FET 200 in FIGS. 2, 3, and 4 and FET 500 in FIG. 5. The FET comprises a drain electrode and a source electrode and has a center and a periphery.

A first step 610 of method 600 is to turn on the FET. As an example of step 610, a voltage applied to the drain electrode of the FET is higher than a voltage applied to the source electrode of the FET, and a voltage applied to the gate electrode of the FET is higher than a threshold voltage for the FET. A second step 620 of method 600 is to operate the FET in an on-state. As an example of step 620, the voltage applied to the drain electrode may vary, but remains higher than the voltage applied to the source electrode, and the voltage applied to the gate electrode may vary, but remains higher than the threshold voltage for the FET. In this on-state, the FET sustains a current between the source electrode and the drain electrode. As has been discussed hereinabove, this current is referred to as a drain-to-source current. In one embodiment, step 620 operates the FET in a saturation region to sustain a drain-to-source saturation current.

A third step 630 of method 600 is to vary the drain-to-source saturation current across the FET. For example, in a particular embodiment, the FET produces a drain-to-source saturation current comprising at least a first portion and a second portion. The first portion of the drain-to-source saturation current is located at or produced from a first region of the FET, and the second portion of the drain-to-source saturation current is located at or produced from a second region of the FET. The first portion of the drain-to-source saturation current divided by an area of the first region is different from the second portion of the drain-to-source saturation current divided by an area of the second region. The FET may comprise more than two regions arranged, for example, as a series of concentric regions, as shown in FIG. 4, or in some other arrangement such as a checkerboard-like pattern such as is shown in FIG. 5. A fourth step 640 of method 600 is to maintain a substantially constant threshold voltage across the FET.

In one embodiment of method 600, two or more of steps 620, 630, and 640 can be performed simultaneously with each other. In one embodiment, method 600 ensures that the drain-to-source saturation current per unit area has a lower value at the center of the FET than at the periphery of the FET. This situation allows optimization of the FET's energy capability, meaning, among other things, that the amount of power the FET may absorb before being destroyed is higher than it would be if the optimization of method 600 were not performed.

This difference in drain-to-source saturation current per unit area in different regions across the FET may be accomplished by imposing on the first region a first value of a characteristic selected from the group consisting of gate-to-source voltage, channel length, channel width, gate oxide thickness, and channel mobility on the first region, and imposing on the second region a second value of the selected characteristic different from the first value of the characteristic. In at least one embodiment, the first value produces the first drain-to-source current, and the second value produces the second drain-to-source current. In a different embodiment, the values of more than one characteristic can be varied per region, and/or values of different characteristics can be varied in different regions.

As an example, each one of the regions across the FET may be provided with a different gate-to-source voltage. In one embodiment, this may be done with a resistor-divider network described hereinabove with reference to FIG. 3, and, in a particular embodiment, may be done so as to increase the gate-to-source voltage towards the periphery of the FET as described in connection with FIG. 4. In another embodiment, the gate-to-source voltage may be increased towards the corners of the FET, as described in connection with FIG. 5.

In yet another embodiment of method 600 of FIG. 6, $I_{ds(sat)}$ per unit area across the FET is varied by varying the channel length L across the FET. As an example, when the FET is an N-type power LDMOS device, L is defined by a distance between an outer boundary of a P-type body region and an outer boundary of an N-type source region in the N-type power LDMOS device. As L increases, $I_{ds(sat)}$ decreases (see equation [1]). Therefore, to improve energy capability, channel lengths should be longer at the center of the device and shorter at the periphery of the device. This channel length variation may be accomplished, in one embodiment, using a graded polysilicon photolithographic etch mask to grade or step the edge of the polysilicon gate electrodes. The gradation may be in discrete steps or may be a smooth transition. In this embodiment, the outer edge of the P-type body is kept substantially straight.

Figure 7:
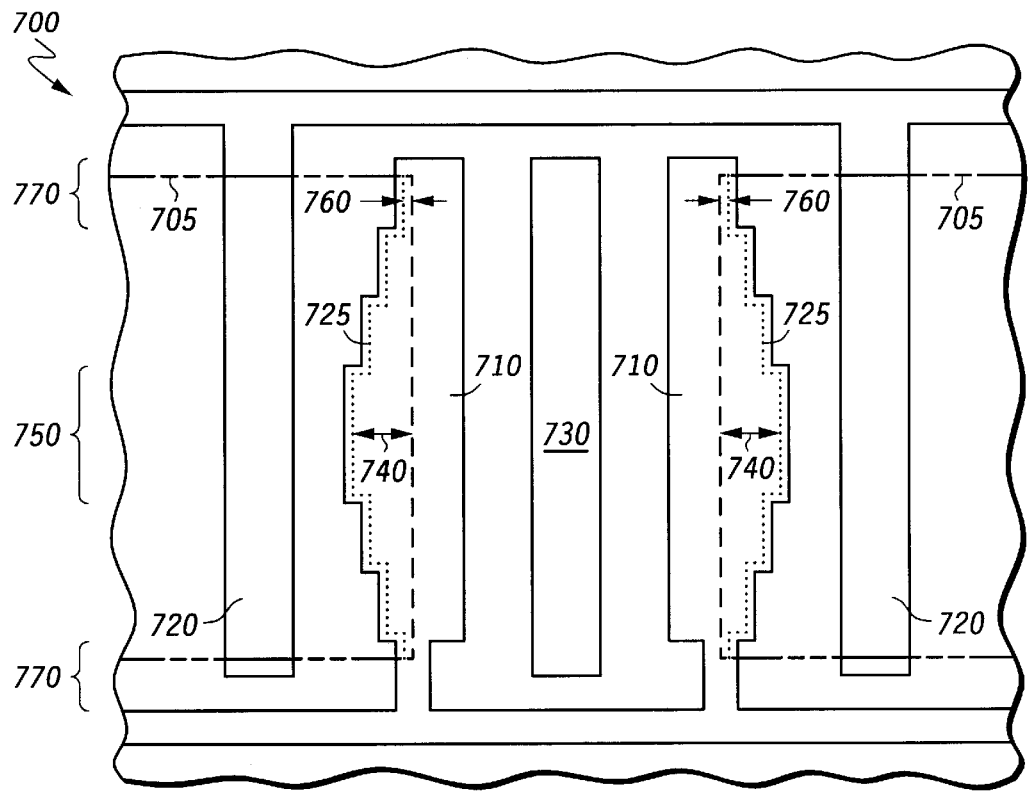
FIG. 7 is a top view of a portion of a field effect transistor according to an embodiment of the invention.

An example of the embodiment where the polysilicon gate electrodes are stepped or graded while the outer edge of the P-type body is kept substantially straight is illustrated in FIG. 7, which shows a FET 700. FET 700 comprises P-type body regions 705 (indicated by dashed lines), N-type source regions 725 (indicated by dotted lines), gate electrodes 710, source electrodes 720, and drain electrodes 730. The outer boundaries of P-type body regions 705 and gate electrodes 710 are non-parallel with each other, and the outer boundaries of N-type source regions 725 and gate electrodes 710 can be substantially parallel with each other. Gate electrodes 710 and source electrodes 720 are formed over P-type body regions 705 and N-type source regions 725.

FET 700 further comprises a center region 750 and a periphery 770. The channel region of FET 700 is defined by a distance between the outer boundaries of P-type body regions 705 and the outer boundaries of N-type source regions 725. In the embodiment illustrated in FIG. 7, gate electrodes 710 and the outer boundaries of N-type source regions 725 are stepped in such a way that a channel length 740 at center region 750 of FET 700 is greater than a channel length 760 at periphery 770 of FET 700.

Figure 8:
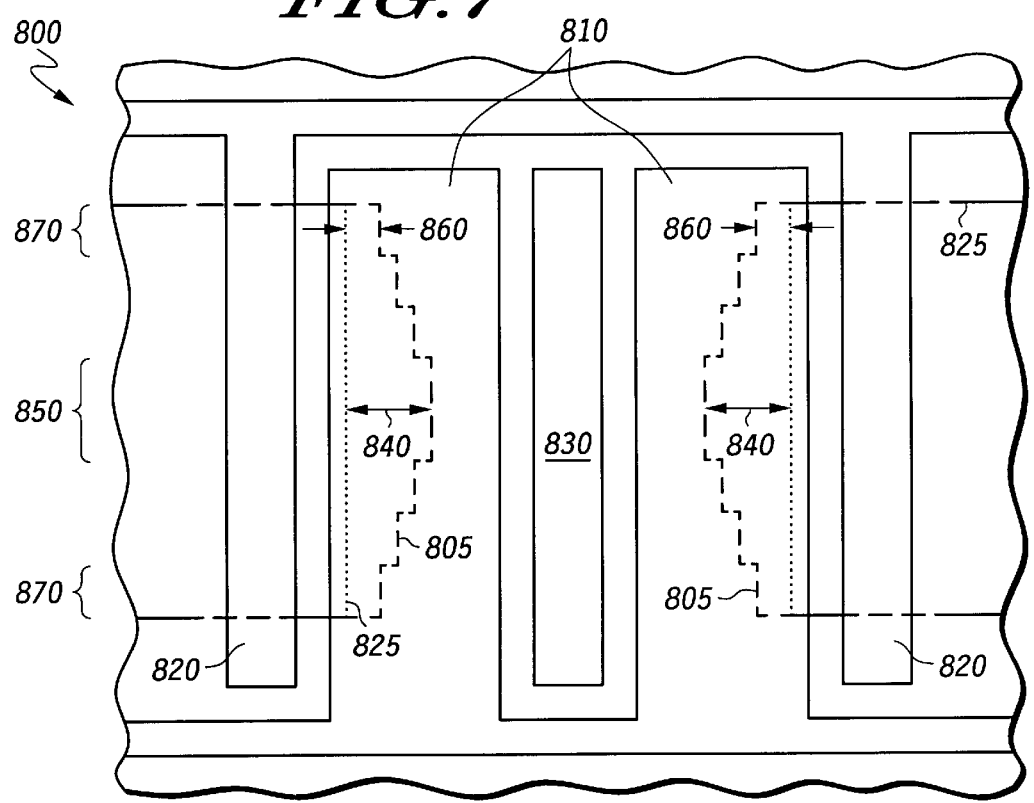
FIG. 8 is a top view of a portion of another field effect transistor according to an embodiment of the invention.

The channel length variation may be accomplished, in another embodiment, using a graded P-type body photolithographic implant mask to grade or step the outer edge of the P-type body region with respect to the edge of the gate electrodes and the N-type source regions. The gradation may be in discrete steps or may be a smooth transition. The outer edges of the gate electrodes and the N-type source regions are kept substantially straight. An example of the embodiment where the outer edge of the P-type body is graded or stepped while the outer edges of the gate electrodes and the N-type source regions are kept substantially straight is illustrated in FIG. 8, which shows a FET 800. FET 800 comprises P-type body regions 805 (indicated by dashed lines), N-type source regions 825 (indicated by dotted lines), gate electrodes 810, source electrodes 820, and drain electrodes 830. The outer boundaries of P-type body regions 805 and gate electrodes 810 are non-parallel with each other, and the outer boundaries of N-type source regions 825 and gate electrodes 810 can be substantially parallel with each other. Gate electrodes 810 and source electrodes 820 are formed over P-type body regions 805 and N-type source regions 825.

FET 800 further comprises a center region 850 and a periphery 870. The channel region of FET 800 is defined by a distance between the outer boundaries of P-type body regions 805 and the outer boundaries of N-type source regions 825. In the embodiment illustrated in FIG. 8, gate electrodes 810 and the outer boundaries of N-type source regions 825 are stepped in such a way that a channel length 840 at center region 850 of FET 800 is greater than a channel length 860 at periphery 870 of FET 800.

Another embodiment of method 600 in FIG. 6 comprises varying $I_{ds(sat)}$ per unit area across the FET by varying the channel mobility $\mu_n$ across the FET. In a particular embodiment, this mobility variation may be accomplished by implanting a non-dopant in certain portions of the channel across the FET in order to damage the crystalline structure in such portions of the FET. As an example, the non-dopant used may be argon, silicon, oxygen, or nitrogen. Alternatively, the non-dopant may be a compound containing any of the foregoing elements, or some other non-dopant. The non-dopant is implanted with a higher implant dose and/or higher implant energy into the portions of the channel located closer to a center portion of the FET to reduce the channel mobility towards the center of the FET. As an example, the patterns described in FIGS. 4 and 5 for varying $V_{gs}$ can also be used for varying channel mobility.

Still another embodiment of method 600 comprises varying $I_{ds(sat)}$ per unit area across the FET by varying the gate oxide thickness across the FET. Gate oxide thickness is represented herein by the symbol $t_{ox}$. This gate oxide thickness is related to the $C_{ox}$ term in equation [1] through the relationship given in equation [2], where $C_{ox}$ is the gate oxide capacitance per unit area and $\epsilon_{ox}$ is the permittivity of the gate oxide.

$$C_{ox} = (\epsilon_{ox})/(t_{ox}) \qquad [2]$$

As shown by equation [1], reducing $C_{ox}$ reduces $I_{ds(sat)}$, meaning the energy capability of the FET may be improved by reducing $C_{ox}$ in the center of the FET relative to the periphery of the FET. In one embodiment, oxide thickness may be formed in the desired manner by first growing a thick gate oxide over the entire device, patterning the thick gate oxide over the center of the FET, then growing an additional, but thinner, gate oxide over the periphery of the FET. This second step may be accomplished, in one embodiment, using an oxide mask in the center of the FET. As an example, the patterns described in FIGS. 4 and 5 for varying $V_{gs}$ can also be used for varying gate oxide thickness.

Yet another embodiment of method 600 comprises varying $I_{ds(sat)}$ per unit area across the FET by varying the channel width W. Equation [1] shows that a reduction in W equates to a reduction in $I_{ds(sat)}$, meaning the energy capability of the FET may be improved by reducing W in the center of the FET relative to the periphery of the FET. Referring back to FIG. 2, W may be reduced, in one embodiment, by removing some of gate electrodes 210, 221, 231, and/or 241 such that fewer gate electrodes per unit area remain towards the center of FET 200. As an example, the patterns described in FIGS. 4 and 5 for varying $V_{gs}$ can also be used for varying channel width. In another embodiment, ring 220 of gate electrodes 221 may be removed altogether, leaving a hole towards the center of FET 200.

Although the invention has been described with reference to specific embodiments, it will be understood by those skilled in the art that various changes may be made without departing from the spirit or scope of the invention. For example, instead of applying different values of the various characteristics discussed herein to different regions of a single device, the benefits of the invention could also be achieved by varying the values of the characteristics across an array of separate devices that are electrically coupled together. As another example, using equation [2], the gate oxide permittivity can be varied across the FET by varying the chemical composition of the gate oxide across the FET. As yet another example, referring to FIGS. 7 and 8, to vary the channel length, the outer boundaries of each of the gate electrode, the P-type body regions, and the N-type source regions can be graded or stepped. Accordingly, the disclosure of embodiments of the invention is intended to be illustrative of the scope of the invention and is not intended to be limiting. It is intended that the scope of the invention shall be limited only to the extent required by the appended claims. To one of ordinary skill in the art it will be readily apparent that the invention discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. A method of operating a semiconductor component having at least one field effect transistor, the method comprising:
   turning on the field effect transistor; and
   operating the field effect transistor in an on-state to produce a drain-to-source current comprising:
      at least first and second portions of the drain-to-source current, the first portion of the drain-to-source current produced by a first region of the field effect transistor, and the second portion of the drain-to-source current produced by a second region of the field effect transistor,
   wherein:
      the field effect transistor has a center closer to the first region than to the second region;
      the first portion of the drain-to-source current divided by an area of the first region is less than the second portion of the drain-to-source current divided by an area of the second region;
      the first region has a first value of a characteristic selected from the group consisting of gate-to-source voltage, channel length, channel width, gate oxide thickness, and channel mobility;
      the second region has a second value of the characteristic different from the first value of the characteristic; and
      the first value produces the first portion of the drain-to-source current and the second value produces the second portion of the drain-to-source current.

2. The method of claim 1 wherein:
   the field effect transistor is selected from the group consisting of a MOSFET, a MESFET, and a JFET.

3. The method of claim 1 wherein:
   the field effect transistor comprises more than two regions, including the first region and the second region;
   the more than two regions are arranged concentrically; and the method further comprises:
      providing each one of the more than two regions with a different value of the characteristic.

4. The method of claim 1 wherein:
   the characteristic is the gate-to-source voltage;
   the semiconductor component further comprises a resistor-divider network; and
   the method further comprises:
      providing the first and second values of the gate-to-source voltage using the resistor-divider network.

5. The method of claim 4 wherein:
   the field effect transistor is located on a chip; and
   the resistor-divider network is located on the chip.

6. The method of claim 4 wherein:
   the field effect transistor comprises more than two regions, including the first region and the second region;
   the more than two regions are arranged as a series of concentric regions; and
   the resistor-divider network provides each one of the more than two regions with a different gate-to-source voltage.

7. The method of claim 6 wherein:
   the field effect transistor further comprises a periphery; and the gate-to-source voltage increases from the center towards the periphery and from the first region to the second region.

8. The method of claim 7 wherein:
the field effect transistor is located on a chip; and
the resistor-divider network is located on the chip.

9. The method of claim 4 wherein:
the field effect transistor comprises more than two regions, including the first region and the second region;
the more than two regions are arranged in a checkerboard-like pattern; and
the resistor-divider network provides each one of the more than two regions with a different gate-to-source voltage.

10. The method of claim 9 wherein:
the field effect transistor further comprises corners; and
the gate-to-source voltage increases from the center towards the corners and from the first region to the second region.

11. The method of claim 1 wherein:
the characteristic is the channel length; and
the method further comprises:
providing the first value of the channel length greater than the second value of the channel length.

12. The method of claim 11 wherein:
the method further comprises:
providing the field effect transistor with source regions and body regions; and
outer boundaries of the source regions and the body regions are non-parallel with each other.

13. The method of claim 1 wherein:
the characteristic is the channel mobility; and
the method further comprises:
providing the first value of the channel mobility less than the second value of the channel mobility.

14. The method of claim 13 wherein:
the field effect transistor comprises:
channel regions; and
a non-dopant in the channel regions; the non-dopant is selected from the group consisting of argon, silicon, oxygen, and nitrogen; and
the non-dopant provides the first and second values of the channel mobility.

15. The method of claim 1 wherein:
the characteristic is the gate oxide thickness; and
the method further comprises:
providing the first value of the gate oxide thickness greater than the second value of the gate oxide thickness.

16. The method of claim 1 wherein:
the characteristic is the channel width; and
the method further comprises:
providing the first value of the channel width less than the second value of the channel width.

17. The method of claim 1 wherein:
the field effect transistor comprises gate electrodes; and
the first region has fewer gate electrodes per unit area than the second region.

18. A semiconductor component comprising at least one field effect transistor, the field effect transistor comprising:
a first region capable of generating a first portion of a drain-to-source current of the field effect transistor; and
a second region capable of generating a second portion of the drain-to-source current of the field effect transistor;
wherein:
the field effect transistor has a center closer to the first region than to the second region;
the first portion of the drain-to-source current divided by an area of the first region of the field effect transistor is less than the second portion of the drain-to-source current divided by an area of the second region of the field effect transistor;
the first region has a first value of a characteristic selected from the group consisting of gate-to-source voltage, channel length, channel width, gate oxide thickness, and channel mobility; and
the second region has a second value of the characteristic different from the first value of the characteristic.

19. The semiconductor component of claim 18 wherein:
the field effect transistor is selected from the group consisting of a MOSFET, a MESFET, and a JFET.

20. The semiconductor component of claim 18 further comprising:
a resistor-divider network,
wherein:
the characteristic is the gate-to-source voltage;
the resistor-divider network applies the first value of the gate-to-source voltage to the first region and the second value of the gate-to-source voltage to the second region; and
the first value of the gate-to-source voltage is less than the second value of the gate-to-source voltage.

21. The semiconductor component of claim 20 wherein:
the second region surrounds the first region.

22. The semiconductor component of claim 20 wherein:
the field effect transistor is located on a chip; and
the resistor-divider network is located on the chip.

23. The semiconductor component of claim 20 wherein:
the field effect transistor comprises more than two regions, including the first region and the second region;
the more than two regions are arranged in a checkerboard-like pattern; and
the resistor-divider network provides each one of the more than two regions with a different gate-to-source voltage.

24. The semiconductor component of claim 20 wherein:
the field effect transistor further comprises corners; and
the gate-to-source voltage increases from the center towards the corners and from the first region to the second region.

25. The semiconductor component of claim 18 wherein:
the characteristic is the channel length;
the first region has the first value of the channel length;
the second region has the second value of the channel length; and
the first value of the channel length is greater than the second value of the channel length.

26. The semiconductor component of claim 25 wherein:
the field effect transistor further comprises source regions and body regions; and
outer boundaries of the source regions and the body regions are non-parallel with each other.

27. The semiconductor component of claim 18 wherein:

the characteristic is the gate oxide thickness;

the first region has the first value of the gate oxide thickness;

the second region has the second value of the gate oxide thickness; and the first value of the gate oxide thickness is greater than the second value of the gate oxide thickness.

28. The semiconductor component of claim 18 wherein:

the characteristic is the channel mobility;

the first region has the first value of the channel mobility;

the second region has the second value of the channel mobility; and the first value of the channel mobility is less than the second value of the channel mobility.

29. The semiconductor component of claim 28 wherein:

the field effect transistor comprises:
 channel regions; and
 a non-dopant in the channel regions;

the non-dopant is selected from the group consisting of argon, silicon, oxygen, and nitrogen; and the non-dopant provides the first and second values of the channel mobility.

30. The semiconductor component of claim 18 wherein:

the characteristic is the channel width;

the first region has the first value of the channel width;

the second region has the second value of the channel width; and the first value of the channel width is less than the second value of the channel width.

31. The semiconductor component of claim 18 wherein:

the field effect transistor further comprises gate electrodes; and the first region has fewer gate electrodes per unit area than the second region.

32. A method of operating a semiconductor component having at least one field effect transistor comprising a first region and a second region, the method comprising the steps of:

turning on the field effect transistor; and operating the field effect transistor in an on-state to produce a drain-to-source saturation current comprising at least a first portion produced by the first region and a second portion produced by the second region, wherein:

the first portion of the drain-to-source saturation current has a different current per unit area than does the second portion of the drain-to-source saturation current; and the first region has a first threshold voltage and the second region has a second threshold voltage substantially equal to the first threshold voltage.

33. The method of claim 32 wherein:

the first region forms a center of the field effect transistor and the second region forms a periphery of the field effect transistor; and operating the field effect transistor in the on-state comprises:

producing the drain-to-source saturation current having a lower value per unit area at the center than at the periphery.

34. The method of claim 33 wherein:

the first region has a first value of a characteristic selected from the group consisting of gate-to-source voltage, channel length, channel width, gate oxide thickness, and channel mobility;

the second region has a second value of the characteristic different from the first value of the characteristic; and the first value produces the first portion of the drain-to-source saturation current and the second value produces the second portion of the drain-to-source saturation current.

35. The method of claim 32 wherein:

the first region has a first value of a characteristic;

the second region has a second value of the characteristic different from the first value of the characteristic; and the field effect transistor has a center closer to the first region than to the second region.

\* \* \* \* \*